US011287294B2

United States Patent
Iwashita et al.

(10) Patent No.: US 11,287,294 B2
(45) Date of Patent: Mar. 29, 2022

(54) FIELD DEVICE, METHOD OF DIAGNOSING FIELD DEVICE AND DIAGNOSTIC APPARATUS

(71) Applicant: YOKOGAWA ELECTRIC CORPORATION, Musashino (JP)

(72) Inventors: Junichi Iwashita, Musashino (JP); Toru Shimura, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 155 days.

(21) Appl. No.: 16/441,360

(22) Filed: Jun. 14, 2019

(65) Prior Publication Data
US 2020/0003591 A1 Jan. 2, 2020

(30) Foreign Application Priority Data
Jun. 28, 2018 (JP) .............................. JP2018-123156

(51) Int. Cl.
*G01D 18/00* (2006.01)
*G01D 21/00* (2006.01)
(Continued)

(52) U.S. Cl.
CPC .............. *G01D 18/00* (2013.01); *G01D 21/00* (2013.01); *G01R 31/00* (2013.01); *G05B 1/01* (2013.01);
(Continued)

(58) Field of Classification Search
CPC ........ G05B 24/00; G05B 23/00; G05B 17/00; G05B 1/01; G05B 6/02; G05B 13/02;
(Continued)

(56) References Cited

U.S. PATENT DOCUMENTS 7,321,846 B1 * 1/2008 Huisenga .................. H04L 1/24
702/183
2003/0154051 A1 * 8/2003 Okazaki .................. G07C 3/00
702/183
(Continued)

FOREIGN PATENT DOCUMENTS

CN 106199253 A * 12/2016
CN 107909804 A * 4/2018
(Continued)

OTHER PUBLICATIONS

Paunonen et al. ("Automatic Process Diagnostics", Kayttovarmuus Ja Kunnon Hallinta; VTT Symposium on Condition Monitoring; Nov. 18, 1999; in: VTT Symposium; vol. 196, Technical Research Centre of Finland, FI, vol. 196 Jan. 1, 1999 (Jan. 1, 1999), pp. 31-38, XP009506210, ISBN: 978-951-38-5272-6) (Year: 1999).*
(Continued)

*Primary Examiner* — Daniel R Miller
*Assistant Examiner* — Christian T Bryant
(74) *Attorney, Agent, or Firm* — Westerman, Hattori, Daniels & Adrian, LLP

(57) ABSTRACT

In order to improve the adaptability of diagnosis of an operating state of a field device, a field device 10 according to the present disclosure has a diagnoser 17 configured to diagnose an operating state of the field device 10 by hierarchically implementing a plurality of diagnostic processes. The diagnoser 17 can select whether to enable or disable a diagnostic result of at least one diagnostic process of a plurality of diagnostic processes in a diagnostic process after the one diagnostic process.

3 Claims, 4 Drawing Sheets

(51) Int. Cl.

| | | |
|---|---|---|
| *G05B 19/042* | (2006.01) | |
| *G01R 31/00* | (2006.01) | |
| *G05B 24/00* | (2006.01) | |
| *G05B 17/00* | (2006.01) | |
| *G06F 11/00* | (2006.01) | |
| *H04L 1/24* | (2006.01) | |
| *G05B 1/01* | (2006.01) | |
| *G05B 13/02* | (2006.01) | |
| *G05B 6/02* | (2006.01) | |
| *G05B 11/01* | (2006.01) | |
| *G05B 19/02* | (2006.01) | |
| *G08C 25/00* | (2006.01) | |
| *G05B 23/00* | (2006.01) | |

(52) U.S. Cl.
CPC ............... *G05B 6/02* (2013.01); *G05B 11/01* (2013.01); *G05B 13/02* (2013.01); *G05B 17/00* (2013.01); *G05B 19/02* (2013.01); *G05B 19/042* (2013.01); *G05B 23/00* (2013.01); *G05B 24/00* (2013.01); *G06F 11/00* (2013.01); *G06F 2201/00* (2013.01); *G08C 25/00* (2013.01); *H04L 1/24* (2013.01)

(58) Field of Classification Search
CPC ...... G05B 11/01; G05B 19/02; G05B 19/042; G01D 18/00; G01D 21/00; H04L 1/24; G08C 25/00; G06F 11/00; G06F 2201/00; G01R 31/00
See application file for complete search history.

(56) References Cited

U.S. PATENT DOCUMENTS

| | | | | |
|---|---|---|---|---|
| 2009/0083001 A1* | 3/2009 | Huisenga | ............ | G05B 23/0224 702/185 |
| 2010/0070213 A1* | 3/2010 | Anklam | ............ | H02J 13/00002 702/60 |
| 2014/0100668 A1 | 4/2014 | Jundt et al. | | |
| 2014/0130874 A1* | 5/2014 | Burlage | ............ | G01F 23/0038 137/1 |
| 2016/0287470 A1* | 10/2016 | Lewis | ............ | A61B 5/361 |
| 2018/0068550 A1* | 3/2018 | Ratilla | ............ | G01D 18/00 |
| 2018/0139102 A1 | 5/2018 | Luber et al. | | |

FOREIGN PATENT DOCUMENTS

| | | |
|---|---|---|
| CN | 107909804 A | 4/2018 |
| JP | 4-9214 A | 1/1992 |
| JP | 8-320726 A | 12/1996 |
| JP | 2003242271 A | 8/2003 |
| JP | 2014-6184 A | 1/2014 |
| JP | 2015042867 A | 3/2015 |

OTHER PUBLICATIONS

Yokogawa Electric Corporation, FieldMate NE 107 Field Diagnostics User's Manual, Yokogawa Electric Corporation, IM 01R01A15-01EN, 3rd Edition, Jul. 6, 2016 (Year: 2016).*

Ajmeri, "Frame Application FieldMate and NE 107 Compliant Device DTMs Enable Diagnostic Tunneling and Alarm Management", Yokogawa Corporation of America, Jan. 14, 2014 (Year: 2014).*

Paunonen, Sara et al.,"Automatic Process Diagnostics", Kayttovarmuus Ja Kunnon Hallinta; VTT Symposium on Condition Monitoring; Nov. 18, 1999; in: VTT Symposium; ISSN 0357-9387; vol. 196, Technical Research Centre of Finland, FI, vol. 196, Jan. 1, 1999 (Jan. 1, 1999), pp. 31-38, XP009506210; Cited in Extended European Search Report dated Nov. 26, 2019. (11 pages).

"FieldMate NE 107 Field Diagnostics User's Manual", Yokogawa Electric Corporation, IM 01R01A15-01 EN 3rd Edition, 2016, cited in CN Office Action dated Dec. 7, 2021. (27 pages).

Amit Ajmeri, "Frame Application FieldMate and NE 107 Compliant Device DTMs Enable Diagnostic Tunneling and Maim Management", Safety Instrumented System/ Asset Management, Jan. 14, 2014, cited in CN Office Action dated Dec. 7, 2021. (5 pages).

* cited by examiner

FIELD DEVICE, METHOD OF DIAGNOSING FIELD DEVICE AND DIAGNOSTIC APPARATUS

CROSS-REFERENCE TO RELATED APPLICATION

The present application claims priority to and the benefit of Japanese Patent Application No. 2018-123156 filed on Jun. 28, 2018, the entire contents of which are incorporated herein by reference.

TECHNICAL FIELD

The present disclosure relates to a field device, a method of diagnosing a field device and a diagnostic apparatus.

BACKGROUND

In the plants having a variety of equipment, a plurality of field devices such as flowmeters, transmitters, scientific devices (pH meters) and actuators such as valves are installed for the purpose of measurement of the state of fluid inside a variety of equipment installed in the plant and control of fluid and the like. Some of such field devices have a self-diagnosis function to diagnose whether a field device itself normally operates or not (see, for example, Patent Literature 1 (PTL 1)).

In a self-diagnosis of a field device, when a self-diagnosis is hierarchically made by a plurality of diagnostic processes as in the case where a diagnostic result of one diagnostic process is used by a subsequent diagnostic process, the diagnostic result of a previous diagnostic process affects a subsequent diagnostic result.

CITATION LIST

Patent Literature

PTL 1: JP2014-006184A

SUMMARY

A field device according to some embodiments has a diagnoser configured to diagnose an operating state of the field device by hierarchically implementing a plurality of diagnostic processes. The diagnoser can select whether to enable or disable a diagnostic result of at least one diagnostic process of the diagnostic processes in a diagnostic process after the one diagnostic process.

A method of diagnosing a field device according to some embodiments includes a diagnostic step of diagnosing an operating state of the field device by hierarchically implementing a plurality of diagnostic processes, wherein, in the diagnostic step, it is possible to select whether to enable or disable a diagnostic result of one diagnostic process of the diagnostic processes in a diagnostic process after the one diagnostic process.

A diagnostic apparatus according to some embodiments has an acquirer configured to acquire a diagnostic result by a plurality of first diagnostic processes performed in the field device for diagnosing an operating state of the field device; and a diagnoser configured to diagnose the operating state of the field device by one or more second diagnostic processes by using the diagnostic result of the first diagnostic processes, wherein the diagnoser can select whether to enable or disable a diagnostic result of at least one diagnostic process of the first diagnostic processes and the one or more second diagnostic processes in a diagnostic process after the one diagnostic process.

DETAILED DESCRIPTION

Figure 1:
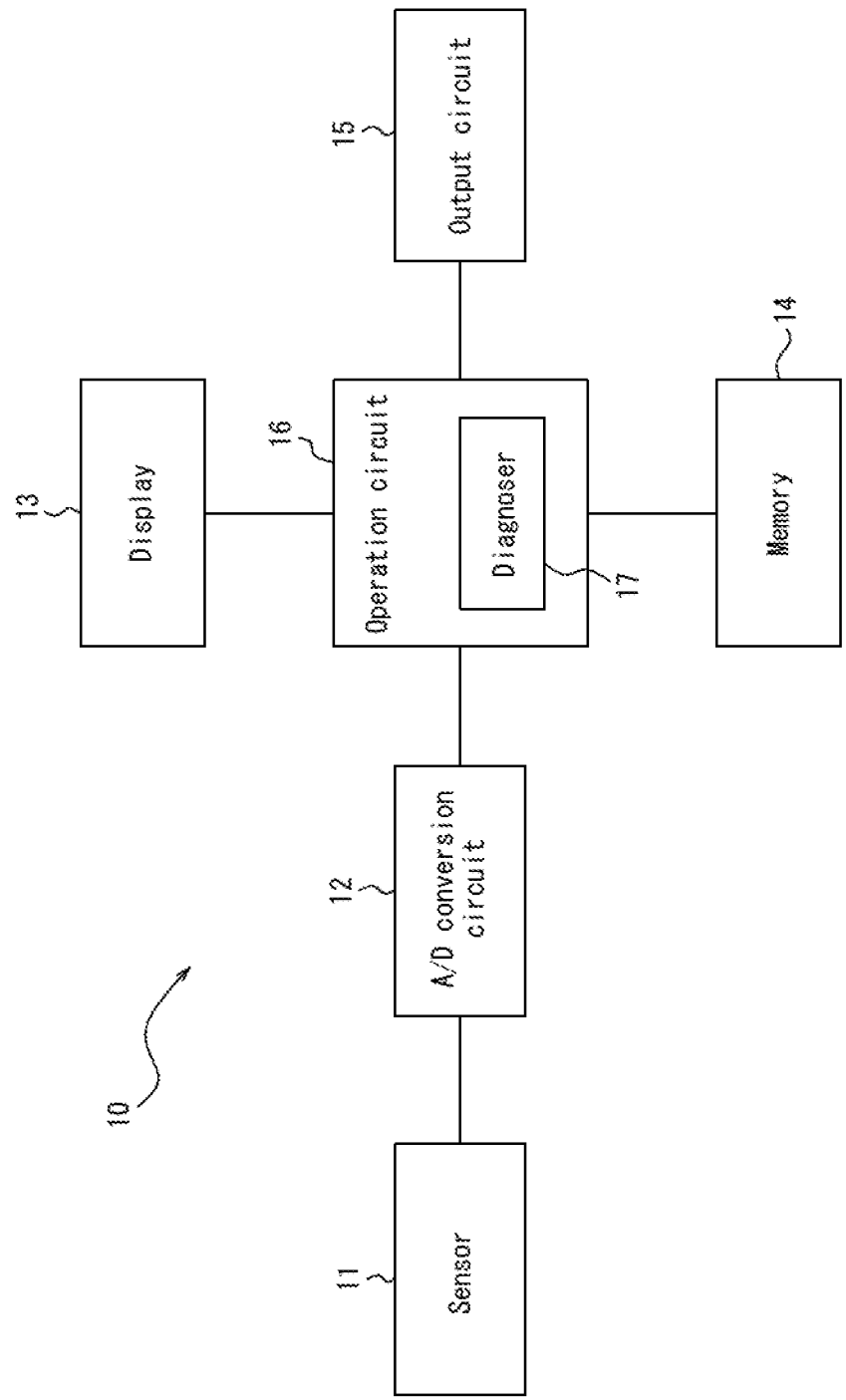
FIG. 1 is a block diagram illustrating a configuration example of a field device according to Embodiment 1 of the present disclosure.

A field device is used in a variety of environments and applications. Under a specific use condition, there are some cases where the operating state of the field device may be treated as normal assuming that the condition is known. However, in this case, there are some cases where the diagnostic result of a specific diagnostic process is "Fail", and the diagnostic result of a process after the specific diagnostic process is also "Fail", which may cause the diagnostic result of the operating state of the field device to be "Fail". For example, when the field device is an electromagnetic flowmeter, a noise generated depending on the state of a wetted surface between an electrode and a fluid is increased under a certain condition and affects a fluid signal. Even in the case where the operating state of the field device may be treated as normal assuming that the noise is known, the diagnostic result of a specific diagnostic process will be "Fail" due to the noise, and the diagnostic result of the operating state of the field device will be "Fail". Thus there is room for improving the adaptability of a diagnosis of the operating state of a field device under a specific use condition.

It is therefore an object of the present disclosure in view of the above-described problem to provide a field device, a method of diagnosing a field device and a diagnostic apparatus that can improve the adaptability of diagnosis of the operating state of the field device.

A field device according to some embodiments has a diagnoser configured to diagnose an operating state of the field device by hierarchically implementing a plurality of diagnostic processes. The diagnoser can select whether to enable or disable a diagnostic result of at least one diagnostic process of the diagnostic processes in a diagnostic process after the one diagnostic process. In this manner, by making it possible to select whether to enable or disable a diagnostic result of at least one diagnostic process, with respect to a specific diagnostic process, a diagnostic result of the diagnostic process can be disabled. Thus, when a specific use condition is known, even if a diagnostic result of a specific diagnostic process is "Fail", it is possible to prevent a diagnostic result of a subsequent diagnostic process from also being "Fail", and as a result the adaptability of diagnosis of operating state of the field device can be improved.

In an embodiment, when disabling the diagnostic result of the one diagnostic process, the diagnoser diagnoses, in the diagnostic process after the one diagnostic process, without using the disabled diagnostic result of the one diagnostic process. In this manner, when a specific use condition is known, even if a diagnostic result of a specific diagnostic process is "Fail", it is possible to prevent a diagnostic result of a subsequent diagnostic process from also being "Fail", and as a result the adaptability of diagnosis of the operating state of the field device can be improved.

In an embodiment, when disabling the diagnostic result of the one diagnostic process, the diagnoser diagnoses, in the diagnostic process after the one diagnostic process, assuming that the diagnostic result of the one diagnostic process is normal. In this manner, even in the case where the diagnostic result of one diagnostic process is disabled, in a subsequent diagnostic process, a diagnosis can be made by the same process as in the case where a diagnostic result of one diagnostic process is enabled. As a result of this, a configuration can be simplified.

In an embodiment, the diagnoser holds a parameter that indicates whether to enable or disable the diagnostic result of the one diagnostic process, and can select whether to enable or disable the diagnostic result of the one diagnostic process on the basis of the parameter. In this manner, whether to enable or disable a diagnostic result of one diagnostic process can be selected easily on the basis of a parameter.

In an embodiment, the diagnoser holds the parameter in a non-volatile manner. In this manner, a diagnosis can be made without resetting a parameter as far as there is no change in the use condition of the field device. Further, even in the case where a power supply of the field device is turned on and off, a diagnosis can be made without resetting a parameter.

A method of diagnosing a field device according to some embodiments includes a diagnostic step of diagnosing an operating state of the field device by hierarchically implementing a plurality of diagnostic processes, wherein, in the diagnostic step, it is possible to select whether to enable or disable a diagnostic result of one diagnostic process of the diagnostic processes in a diagnostic process after the one diagnostic process. In this manner, by making it possible to select whether to enable or disable a diagnostic result of at least one diagnostic process, with respect to a specific diagnostic process, a diagnostic result of the diagnostic process can be disabled. Thus, when a specific use condition is known, even if a diagnostic result of a specific diagnostic process is "Fail", it is possible to prevent a diagnostic result of a subsequent diagnostic process from also being "Fail". As a result the adaptability of diagnosis of the operating state of the field device can be improved.

A diagnostic apparatus according to some embodiments has an acquirer configured to acquire a diagnostic result by a plurality of first diagnostic processes performed in the field device for diagnosing an operating state of the field device; and a diagnoser configured to diagnose the operating state of the field device by one or more second diagnostic processes by using the diagnostic result of the first diagnostic processes, wherein the diagnoser can select whether to enable or disable a diagnostic result of at least one diagnostic process of the first diagnostic processes and the one or more second diagnostic processes in a diagnostic process after the one diagnostic process. In this manner, by making it possible to select whether to enable or disable a diagnostic result of at least one diagnostic process of the first diagnostic processes and the one or more second diagnostic processes, with respect to a specific diagnostic process, a diagnostic result of the diagnostic process can be disabled. Thus, when a specific use condition is known, even if a diagnostic result of a specific diagnostic process is "Fail", it is possible to prevent a diagnostic result of a subsequent diagnostic process from also being "Fail". As a result the adaptability of diagnosis of the operating state of the field device can be improved.

According to the present disclosure, a field device, a method of diagnosing a field device and a diagnostic apparatus that can improve the adaptability of diagnosis of the operating state of the field device can be provided.

Embodiments of the present disclosure will be described below with reference to the drawings. In each drawing, the same reference signs indicate the identical or similar components.

Embodiment 1

FIG. 1 is a block diagram illustrating a configuration example of a field device 10 according to Embodiment 1 of the present disclosure. The field device 10 according to this embodiment is installed in a plant, and performs measurement of a state of fluid and the like in the equipment installed in a plant and control of fluid and the like. Further, the field device 10 according to this embodiment has a self-diagnosis function that diagnoses, by itself, if the field device 10 itself operates normally. The field device 10 is, for example, a sensor device such as a pressure gauge, a flowmeter and a temperature sensor, a valve device such as a flow control valve and an on-off valve, an actuator device such as a fun and a motor, an image capturing device such as a camera and a video camera that captures an image of a state and an object in a plant, an audio device such as a microphone and a speaker that collects abnormal noise in a plant and outputs alarm, a position detection device that outputs position information of each device and the like. The plants where field devices are installed include industrial plants such as chemical plants, plants that manage and control well site such as gas field and oil field or the periphery of such well site, plants that manage and control power generation such as hydro, thermal and nuclear powers, plants that manage and control environmental power generation such as photovoltaic or wind power and plants that manage and control water and sewage, dams and the like.

The field device 10 illustrated in FIG. 1 has a sensor 11, an A/D conversion circuit 12, a display 13, a memory 14, an output circuit 15 and an operation circuit 16.

The sensor 11 measures the state of fluid and the like (e.g. flow rate, pressure, temperature, level and the like) in equipment in which the field device 10 is installed, and outputs the measurement result (analog measurement signal) to the A/D conversion circuit 12. Configuration of the sensor 11 differs depending on an object to be measured by the sensor 11. Configuration of the sensor 11 for measuring the above described each object to be measured is not directly related to the present disclosure, and thus the description thereof is omitted.

The A/D conversion circuit 12 converts a measurement result (analog measurement signal) output from the sensor 11 into a digital value corresponding to a size of a signal measured by the sensor 11 through analog/digital conversion and outputs it to the operation circuit 16.

The display 13 is a display device such as a Liquid Crystal Display (LCD), for example. The display 13 displays, according to the control of the operation circuit 16, a variety of information such as, for example, the state of fluid and the like in the equipment in which the field device 10 is installed, the diagnostic result of the operating state of the field device 10 and the like. The display 13 may be what is called a touch panel, which is formed by integrating the display 13 and a touch sensor and by disposing a touch face of the touch sensor on the surface of the display 13. When the display 13 is a touch panel, touch operation to the touch panel enables operation input to the field device 10.

The memory 14 stores application program to be implemented by the operation circuit 16, the running data and the like. Examples of the memory 14 include a variety of memories such as, for example, Read Only Memory (ROM), Random Access Memory (RAM) and a flash memory. According to the control of the operation circuit 16, the memory 14 stores (writes) and outputs (readouts) data.

According to the control by the operation circuit 16, the output circuit 15 outputs the measurement result of the sensor 11 to an external device of the field device 10 such as, for example, a control device that controls operation of equipment in a plant. Specifically, the output circuit 15 converts a digital value that is output from the operation circuit 16 and that corresponds to the size of the measurement signal of the sensor 11 into a DC analog signal in a range from 4 mA to 20 mA and outputs to an external device. The output circuit 15 can communicate with an external device by using a communication protocol specified in HART®, BRAIN, Foundation Field Bus®, ISA100.11a and the like.

The operation circuit 16 controls each component included in the field device 10. The operation circuit 16 is a Central Processing Unit (CPU), for example, and controls each component included in the field device 10 according to the application program and data for realizing a function of the field device 10. For example, the operation circuit 16 allows the output circuit 15 to convert a digital value corresponding to the size of the measurement signal of the sensor 11 into a DC analog signal in a range from 4 mA to 20 mA and to output to an external device. Further, the operation circuit 16 allows the display 13 to display a state of fluid in equipment in which the field device 10 is installed.

The operation circuit 16 includes a diagnoser 17. The diagnoser 17 diagnoses the operating state of the field instrument 10 (whether the field device 10 operates normally or not). The diagnoser 17 diagnoses the operating state of the field device 10 by hierarchically implementing a plurality of diagnostic processes. The operation circuit 16 allows the display 13 to display the diagnostic result of the diagnoser 17 or allows the output circuit 15 to output the result to an external device.

Next, a method of diagnosing the operating state of the field device 10 by the diagnoser 17 will be described. First, as a comparative example, a conventional method of diagnosing the operating state of a field device will be described.

Figure 2:
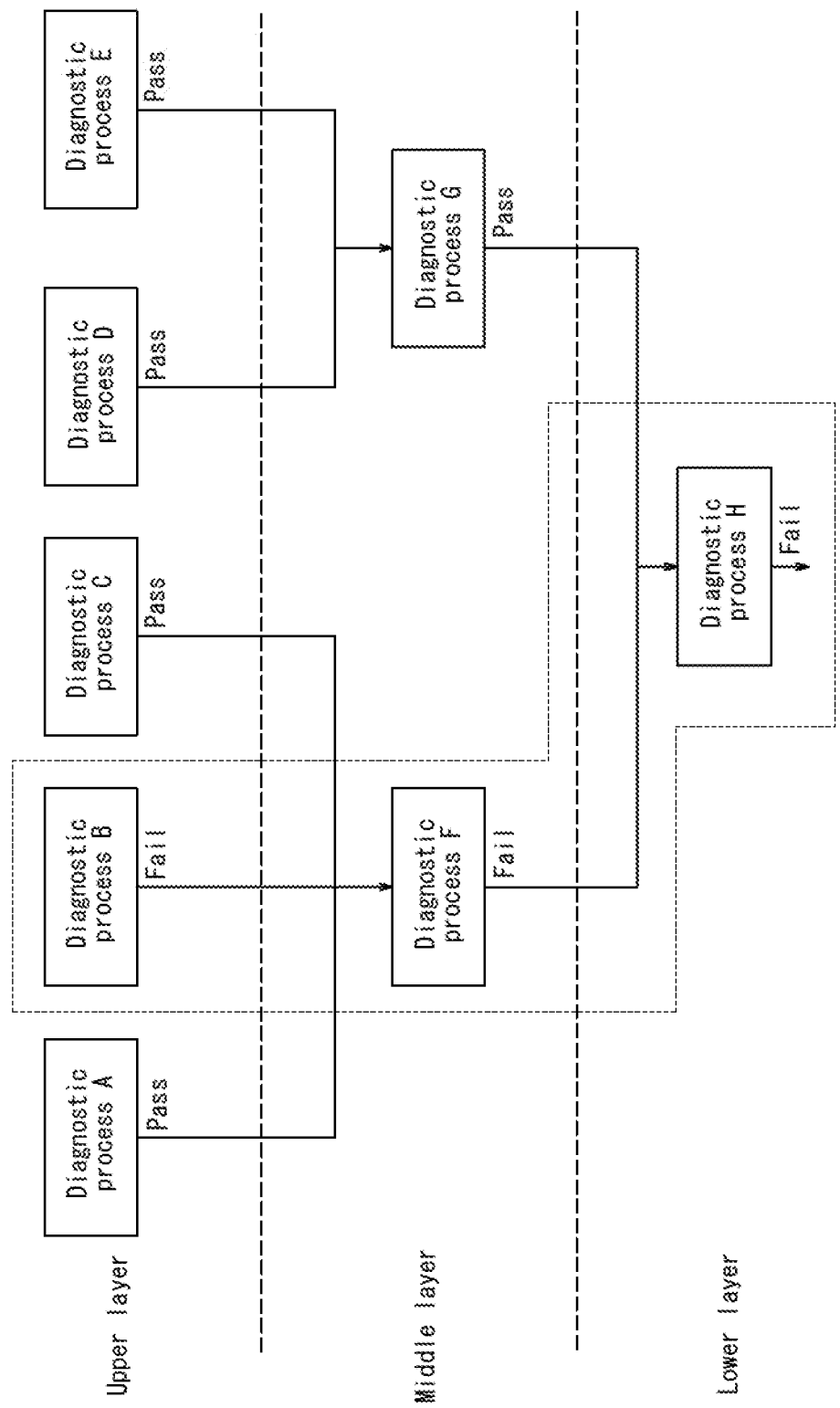
FIG. 2 is a diagram illustrating a conventional method of diagnosing an operating state of a field device.

In a field device with a self-diagnosis function, diagnosis of an operating state of the field device is generally made by a plurality of diagnostic processes. Further, in a field device with a complex structure, a plurality of diagnostic processes are implemented comprehensively or in stages to determine whether the operating state of the field device is normal or abnormal. As illustrated in FIG. 2, a diagnosis is made by dividing into an upper layer, a middle layer and a lower layer, for example.

In the example illustrated in FIG. 2, the upper layer includes diagnostic processes A to E. In each of the diagnostic processes A to E, an operating state of a predetermined object to be diagnosed is diagnosed and whether the operating state of the object to be diagnosed is normal ("Pass") or defective ("Fail") is determined. The object to be diagnosed in the diagnostic processes A to E is a component included in the field device 10. For example, examples of components include an exciting circuit configured to drive the sensor 11, a signal detection circuit configured to detect a signal generated at an electrode provided in the sensor 11, the A/D conversion circuit 12 and the like, and the object to be diagnosed in the diagnostic processes A to E may be values (variables) being different from each other and treated inside the identical component.

The middle layer includes diagnostic processes F and G. In diagnostic process F, a diagnosis is made on the basis of the diagnostic results of diagnostic processes A, B and C. Specifically, if the diagnostic results of diagnostic processes A, B and C are all "Pass", the diagnostic result of diagnostic process F is "Pass". Further, if at least one of the diagnostic results of diagnostic processes A, B and C is "Fail", the diagnostic result of diagnostic process F is "Fail". In the example of FIG. 2, since the diagnostic result of diagnostic process B is "Fail", the diagnostic result of diagnostic process F is "Fail".

Further, in diagnostic process G, a diagnosis is made on the basis of the diagnostic results of diagnostic processes D and E. Specifically, if the diagnostic results of diagnostic processes D and E are all "Pass", the diagnostic result of diagnostic process G is "Pass". Further, if at least one of the diagnostic results of diagnostic processes D and E is "Fail", the diagnostic result of diagnostic process G is "Fail". In the example of FIG. 2, since the diagnostic results of diagnostic processes D and E are "Pass", the diagnostic result of diagnostic process G is "Pass".

The lower layer includes diagnostic process H. In diagnostic process H, a diagnosis is made on the basis of the diagnostic results of diagnostic processes F and G. Specifically, if the diagnostic results of diagnostic processes F and G are all "Pass", the diagnostic result of diagnostic process H is "Pass". Further, if at least one of the diagnostic results of diagnostic processes F and G is "Fail", the diagnostic result of diagnostic process H is "Fail". In the example of FIG. 2, since the diagnostic result of diagnostic process F is "Fail", the diagnostic result of diagnostic process H is "Fail".

The diagnostic result of each diagnostic process illustrated in FIG. 2 is as indicated in Table 1 below.

TABLE 1

| Upper layer | | Middle layer | | Lower layer | |
| --- | --- | --- | --- | --- | --- |
| Diagnostic process | Diagnostic result | Diagnostic process | Diagnostic result | Diagnostic process | Diagnostic result |
| A | Pass | F | Fail | H | Fail |
| B | Fail | | | | |
| C | Pass | | | | |
| D | Pass | G | Pass | | |
| E | Pass | | | | |

As illustrated in FIG. 2 and Table 1, when the diagnostic result of diagnostic process B is "Fail", the diagnostic results of diagnostic processes F and H after diagnostic process B are also "Fail". In other words, in the conventional diagnostic method, the diagnostic result of one diagnostic process affects the diagnostic result of a diagnostic process after the one diagnostic process.

Depending on the use condition of a field device, there are some cases where the operating state of the field device may be treated as normal assuming that the condition is known. However, in this case, the diagnostic result of a specific diagnostic process is determined as "Fail", and the diagnostic result of a diagnostic process after the specific diagnostic process is also determined as "Fail", and as a result the operating state of the field device is determined as "Fail". In other words, in the conventional diagnostic method, the diagnostic result of one diagnostic process affects the diagnostic result of a diagnostic process after the one diagnostic process. Thus, under a specific condition, the condition is not adapted, and as a result the operating state of the field device cannot be diagnosed correctly.

Next, the method of diagnosing the operating state of the field device 10 by the diagnoser 17 according to Embodiment 1 will be described with reference to FIG. 3. As with FIG. 2, the diagnoser 17 diagnoses the operating state of the field device 10 by hierarchically implementing a plurality of diagnostic processes (diagnostic processes A to H).

The diagnostic method according to this embodiment includes a diagnostic step of diagnosing the operating state of the field device 10 by hierarchically implementing a plurality of diagnostic processes by the diagnoser 17. The diagnoser 17 can, in the diagnostic step, select whether to enable or disable the diagnostic result of at least one diagnostic process of a plurality of diagnostic processes that diagnose the operating state of the field device 10 in a diagnostic process after the one diagnostic process. Specifically, the diagnoser 17 holds parameter X that indicates whether to enable or disable the diagnostic result of at least one diagnostic process X of a plurality of diagnostic processes. Further, the diagnoser 17 selects whether to enable or disable the diagnostic result of one diagnostic process on the basis of the parameter. For example, when parameter X corresponding to diagnostic process X is "Enable," the diagnoser 17 enables the diagnostic result of diagnostic process X in a diagnostic process after diagnostic process X. Further, when parameter X corresponding to diagnostic process X is "Disable," the diagnoser 17 disables the diagnostic result of diagnostic process X in a diagnostic process after diagnostic process X.

When disabling the diagnostic result of one diagnostic process, the diagnoser 17 diagnoses by not using the disabled diagnostic result of one diagnostic process in a diagnostic process after the one diagnostic process, for example, but by using an enabled diagnostic result in the other diagnostic process. In this case, processing is required for diagnosing by not using the disabled diagnostic result of one diagnostic process but by using only enabled diagnostic result of the other diagnostic process. Thus, when disabling the diagnostic result of one diagnostic process, the diagnoser 17 may, regardless of the diagnostic result of the one diagnostic process, diagnose assuming that the diagnostic result of the one diagnostic process is normal ("Pass") in a diagnostic process after the one diagnostic process. In this manner, even in the case where the diagnostic result of one diagnostic process is disabled, in a subsequent diagnostic process, a diagnosis can be made by the same processing as in the case where the diagnostic result of one diagnostic process is enabled. As a result configuration can be simplified.

Figure 3:
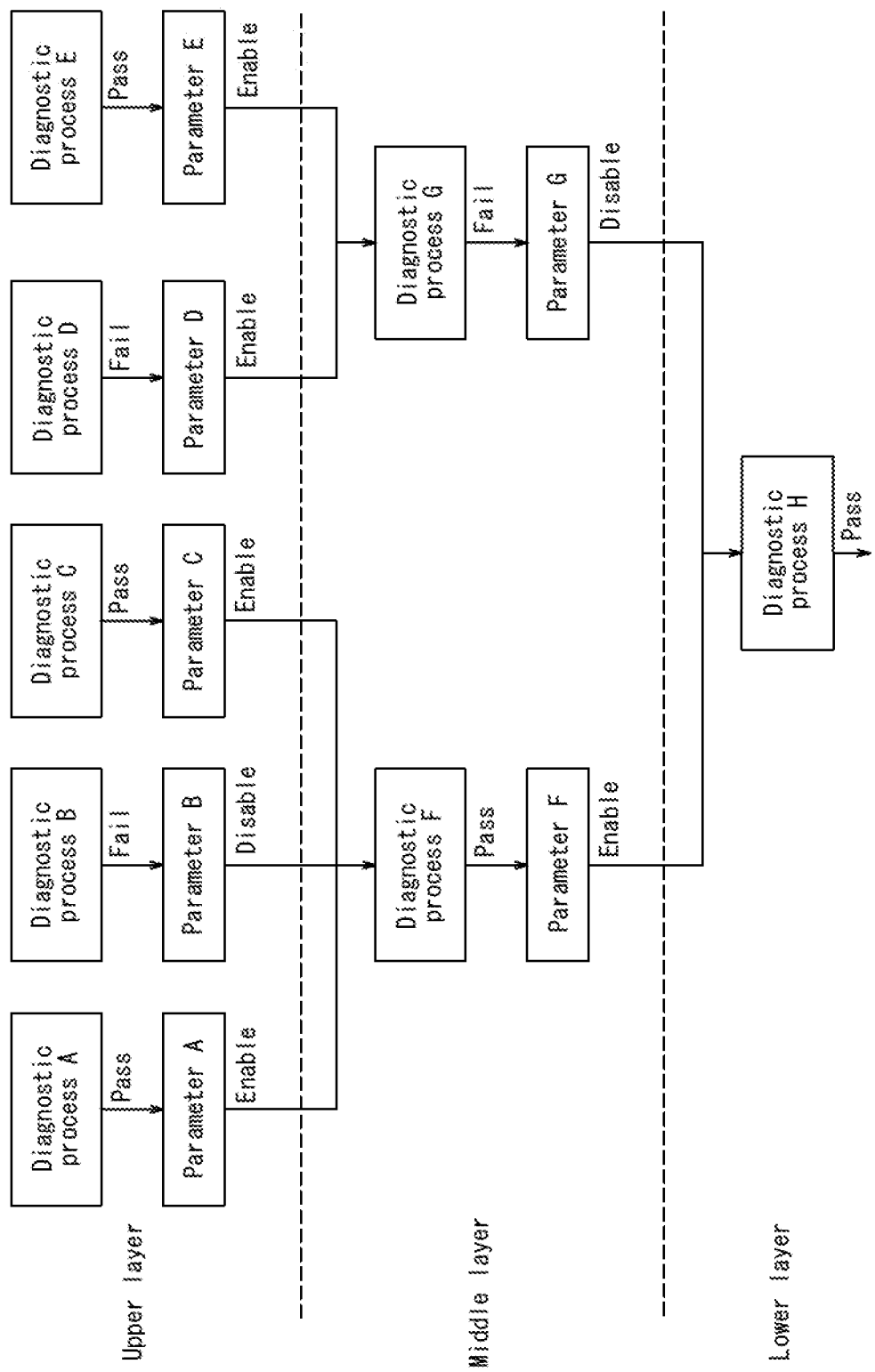
FIG. 3 is a diagram illustrating a method of diagnosing an operating state of a field device by a diagnoser illustrated in FIG. 1.

FIG. 3 illustrates an example where the diagnoser 17 holds parameters X (X: A to G) corresponding to diagnostic processes A to G, respectively. Further, FIG. 3 illustrates an example where "Enable" is set as parameters A, C, D, E and F and "Disable" is set as parameters B and G. In other words, in diagnostic processes B and G, although the diagnostic result is "Fail" according to a specific use condition of the field device 10, it may be treated as "Pass". Further, FIG. 3 illustrates an example where the diagnostic results of diagnostic processes A, C and E included in the upper layer are "Pass" and the diagnostic results of diagnostic processes B and D are "Fail".

In diagnostic process F of the middle layer, the diagnoser 17 diagnoses on the basis of the diagnostic results of diagnostic processes A, B and C. In this case, although the actual diagnostic result of diagnostic process B is "Fail", since "Disable" is set as parameter B, the diagnoser 17 diagnoses, regardless of the diagnostic result, that is, without using the actual diagnostic result, assuming that the diagnostic result of diagnostic process B is "Pass". Since "Enable" is set as parameters A and C and the diagnostic results of diagnostic processes A and C are "Pass", the diagnoser 17 determines that the diagnostic result of diagnostic process F is "Pass".

In diagnostic process G of the middle layer, the diagnoser 17 diagnoses on the basis of the diagnostic results of diagnostic processes D and E. In this case, the diagnoser 17 determines that the diagnostic result of diagnostic process G is "Fail" on the basis that "Enable" is set as parameters D and E, the diagnostic result of diagnostic process D is "Fail", and the diagnostic result of diagnostic process is "Pass".

The diagnoser 17 diagnoses on the basis of diagnostic results of diagnostic processes F and G in diagnostic process H of the lower layer. In this case, although the actual diagnostic result of diagnostic process G is "Fail", since "Disable" is set as parameter G, the diagnoser 17 diagnoses, regardless of the diagnostic result, that is, without using the actual diagnostic result, assuming that the diagnostic result of diagnostic process G is "Pass". Since "Enable" is set as parameter F and the diagnostic result of diagnostic process F is "Pass", the diagnoser 17 determines that the diagnostic result of diagnostic process H is "Pass".

The diagnostic result of each diagnostic process illustrated in FIG. 3 is as indicated in Table 2 below.

TABLE 2

| Upper layer | | | Middle layer | | | Lower layer | |
| --- | --- | --- | --- | --- | --- | --- | --- |
| Diagnostic process | Diagnostic result | Parameter | Diagnostic process | Diagnostic result | Parameter | Diagnostic process | Diagnostic result |
| A | Pass | Enable | F | Pass | Enable | H | Pass |
| B | Fail | Disable | | | | | |
| C | Pass | Enable | | | | | |
| D | Fail | Enable | G | Fail | Disable | | |
| E | Pass | Enable | | | | | |

As illustrated in FIG. 3 and Table 2, even if the diagnostic result of diagnostic process B is "Fail", "Disable" is set as parameter B. Thus, in the subsequent diagnostic process F, a diagnosis is made by disabling the diagnostic result of diagnostic process B (without using the actual diagnostic result of diagnostic process B or by determining that the diagnostic result of diagnostic process B is "Pass"). Further, even if the diagnostic result of diagnostic process G is "Fail", since "Disable" is set as parameter G, in the subsequent diagnostic process H, a diagnosis is made by disabling the diagnostic result of diagnostic process G (without using the actual diagnostic result of diagnostic process G or by determining that the diagnostic result of diagnostic process G is "Pass"). Thus, even if the diagnostic result may be treated as normal due to a known specific use condition of the field device 10, the diagnoser 17 can prevent the diagnostic result of the subsequent diagnostic process from being also "Fail" when the diagnostic result is determined to be "Fail". As a result the adaptability of diagnosis of the operating state of the field device 10 can be improved. Further, whether to enable or disable the diagnostic result of one diagnostic process can be easily selected on the basis of parameter X.

The parameter X is set by an operator by using, for example, a hand held terminal, which is a mobile information terminal configured to set a variety of parameters of the field device 10. The operator can set parameter X corresponding to each diagnostic process by monitoring the diagnostic result of each diagnostic process in an installation site of the field device 10 during installation of the field device 10 and considering a specific condition and the like. Further, in the case where the display 13 of the field device 10 is provided with a depression type switch button, an infrared type switch button and the like, or where the display 13 is a touch panel, if a variety of parameters of the field device 10 can be set through a switch button or a touch panel, parameter X corresponding to each diagnostic process may be set by an operation input through the touch panel.

Once installed, the position where the field device 10 is installed may not be rarely changed. Thus the diagnoser 17 may preferably hold parameter X corresponding to each diagnostic process in a non-volatile manner, that is, hold parameter X in a non-volatile memory provided in the field device 10. In this manner, if parameter X is set once depending on the installation environment and usage of the field device 10, there is no need to set parameter X again unless the use condition is changed after installation of the field device 10, and thus a diagnosis can be continuously made. Further, after parameter X is set, parameter X is held even if the power supply of the field device 10 is turned on/off. Thus there is no need to set parameter X again, and in this manner a diagnosis can be continuously made.

In this embodiment, although an explanation was given by using an example where parameters X (parameters A to G) are set respectively to all diagnostic processes (diagnostic processes A to G) of the upper layer and the middle layer, setting of parameter X is not limited thereto. For example, the default values of parameters X corresponding to all diagnostic processes in the upper layer and the middle layer may be set to "Enable," and "Disable" may be set to parameters X only for the diagnostic processes (only parameters B and G in FIG. 3) except those require the diagnostic result in the subsequent diagnostic process. In this manner, the labor of setting parameters X can be reduced and the diagnostic result of the diagnostic process required for diagnosing the operating state of the field device 10 can always be enabled. Thus default values are remained and as a result no error in setting may occur.

Further, in this embodiment, although an explanation was given by using an example where the diagnostic result of the diagnostic process in which "Disable" is set as parameter X is treated as "Pass" in the subsequent diagnostic process, it is not limited thereto. For example, in a diagnostic process where a diagnosis is performed by using the diagnostic results of the previous diagnostic processes, a diagnosis may be made by using only the diagnostic results of the diagnostic processes in which parameters X corresponding to the previous diagnostic processes are "Enable" (the diagnostic results of the diagnostic processes in which parameters X are "Disable" are not used).

In this manner, the field device 10 according to this embodiment has the diagnoser 17 configured to diagnose the operating state of the field device 10 by hierarchically implementing a plurality of diagnostic processes. The diagnoser 17 can select whether to enable or disable the diagnostic result of at least one diagnostic process of a plurality of diagnostic processes in a diagnostic process after the one diagnostic process.

In this manner, with respect to a diagnostic process in which the diagnostic result may be treated as "Pass" due to a known specific condition and the like, a diagnostic result of the diagnostic process can be disabled by making it possible to select whether to enable or disable a diagnostic result of at least one diagnostic process. Thus, even though the diagnostic result may be treated as normal due to a known specific use condition, it is possible to prevent the diagnostic result of the subsequent diagnosis from also becoming "Fail" when a diagnostic result of the process is "Fail", and as a result the adaptability of diagnosis of the operating state of the field device 10 can be improved.

Embodiment 2

In Embodiment 1, an explanation was given by using an example where the field device 10 itself diagnoses the operating state. In Embodiment 2 according to the present disclosure, an explanation is given by using an example where a diagnostic apparatus such as a hand held terminal, which is an external device of the field device 10, diagnoses the operating state of the field device 10.

Figure 4:
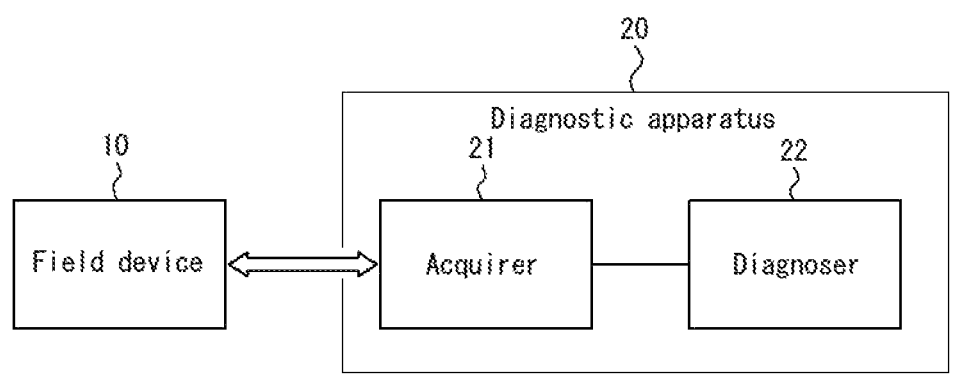
FIG. 4 is a block diagram illustrating a configuration example of a diagnostic apparatus according to Embodiment 2 of the present disclosure.

FIG. 4 is a block diagram illustrating a configuration example of a diagnostic apparatus 20 according to this embodiment. The diagnostic apparatus 20 according to this embodiment is an external device of the field device 10, such as a hand held terminal.

The diagnostic apparatus 20 illustrated in FIG. 4 has an acquirer 21 and a diagnoser 22.

The acquirer 21 transmits/receives data to/from the field device 10 wired or wirelessly. The acquirer 21 acquires diagnostic results of a plurality of diagnostic processes (first diagnostic processes) performed in the field device 10 to diagnose the operating state of the field device 10. It is to be noted that, in this embodiment, only a part of the diagnostic processes (e.g. the diagnostic processes A to E of the upper layer) of a plurality of diagnostic processes (e.g. diagnostic processes A to H in the example in FIG. 3) to diagnose the operating state of the field device 10 are performed in the field device 10 (diagnoser 17). The acquirer 21 outputs the diagnostic results of a plurality of the first diagnostic processes acquired from the field device 10 to the diagnoser 22.

The diagnoser 22 diagnoses the operating state of the field device 10 by one or more second diagnostic processes (e.g. diagnostic processes F, G and H in the example illustrated in FIG. 3) by using the diagnostic results of a plurality of first diagnostic processes output from the acquirer 21. In this case, the diagnoser 22 can select whether to enable or disable the diagnostic result of at least one diagnostic process of a plurality of first diagnostic processes or one or more second diagnostic processes in a diagnostic process after the one diagnostic process. It is to be noted that selecting whether to enable or disable the diagnostic result of the diagnostic process and processing such as a diagnosis in a diagnostic process by using a plurality of diagnostic results by the diagnoser 22 are the same as those of the diagnoser 17, and thus explanation thereof will be omitted.

In this manner, in this embodiment, the diagnostic apparatus 20 has an acquirer 21 configured to acquire diagnostic results by a plurality of first diagnostic processes performed in the field device 10 to diagnose the operating state of the field device 10, and a diagnoser 22 configured to diagnose the operating state of the field device 10 by one or more second diagnostic processes by using the diagnostic results of a plurality of first diagnostic processes. The diagnoser 22 can select whether to enable or disable a diagnostic result of at least one diagnostic process of a plurality of first diagnostic processes and one or more second diagnostic processes in a diagnostic process after the one diagnostic process.

In this manner, by making it possible to select whether enable or disable a diagnostic result of at least one diagnostic process, with respect to a diagnostic process in which a diagnostic result can be treated as "Pass" due to a known specific condition, a diagnostic result of the diagnostic process can be disabled. Thus, even though the diagnostic result may be treated as normal due to a known specific use condition, it is possible to prevent the diagnostic result of the subsequent diagnostic process from being also "Fail" when the diagnostic result is "Fail". As a result the adaptability of diagnosis of the operating state of the field device 10 can be improved.

The present disclosure is not limited to the above described embodiments, and may be modified in various manners without departing from the spirit of the present disclosure recited in the claim. For example, functions and the like included in each component, each step and the like may be rearranged without logical inconsistency. A plurality of components or steps can be combined into one or divided.

The invention claimed is:

1. A field device comprising a processor configured to diagnose an operating state of the field device by hierarchically implementing a plurality of diagnostic processes, wherein the processor holds a parameter that indicates whether to enable or disable a diagnostic result of diagnostic process in a non-volatile memory, selects whether to enable or disable a diagnostic result of at least one diagnostic process of the diagnostic processes in a diagnostic process after the at least one diagnostic process on the basis of the parameter held in the non-volatile memory, wherein disabling the diagnostic result of the one diagnostic process, causes the processor to designate the diagnostic result of the one diagnostic process as normal; and the processor performs the diagnostic process after the one diagnostic process based on the diagnostic result of one or a plurality of diagnostic processes including the designated result of the one diagnostic process.

2. A diagnostic method of a field device, comprising:

a holding step of holding a parameter that indicates whether to enable or disable a diagnostic result of diagnostic process in a non-volatile memory, and a diagnostic step of diagnosing an operating state of the field device by hierarchically implementing a plurality of diagnostic processes, wherein, in the diagnostic step, selecting whether to enable or disable a diagnostic result of one diagnostic process of the diagnostic processes in a diagnostic process after the at least one diagnostic process on the basis of the parameters held in the non-volatile memory, wherein disabling the diagnostic result of the one diagnostic process designates the diagnostic result of the one diagnostic process as normal, and performing a diagnostic process after the one diagnostic process based on the diagnostic result of one or a plurality of diagnostic processes including the designated result of the one diagnostic process.

3. A diagnostic apparatus configured to diagnose an operating state of a field device, comprising:

a communication interface configured to acquire a diagnostic result by a plurality of first diagnostic processes performed in the field device for diagnosing the operating state of the field device; and a processor configured to diagnose, by using the diagnostic result of the first diagnostic processes, the operating state of the field device by one or more second diagnostic processes, wherein the processor holds a parameter that indicates whether to enable or disable a diagnostic result of diagnostic process in a non-volatile memory, selects can select whether to enable or disable a diagnostic result of at least one diagnostic process of the first diagnostic processes and the one or more second diagnostic processes in a diagnostic process after the at least one diagnostic process on the basis of the parameter held in the non-volatile memory, wherein disabling the diagnostic result of the one diagnostic process, causes the processor designates the diagnostic result of the one diagnostic process as normal, and the processor performs a diagnostic process after the one diagnostic process based on the diagnostic result of one or a plurality of diagnostic processes including the designated result of the one diagnostic process.

* * * * *